HERMETICALLY ENCAPSULATED BARRIER LAYER RECTIFIER

Filed Dec. 21, 1966

INVENTOR
KENJI TAKATSUKA & SHIGETSUGU TOYOOKA
BY
Morgan, Finnegan, Durham & Pine
ATTORNEYS 3,441,813
HERMETICALLY ENCAPSULATED BARRIER LAYER RECTIFIER Kenji Takatsuka and Shigetsugu Toyooka, Kyoto, Japan, assignors to Japan Storage Battery Co., Ltd., Kyoto, Japan, a corporation of Japan Filed Dec. 21, 1966, Ser. No. 603,511
Int. Cl. H01l *1/10, 9/00*
U.S. Cl. 317—234 8 Claims

ABSTRACT OF THE DISCLOSURE

A solid state rectifier is embedded in elastomer material for accommodating expansion differentials. An encircling member is disposed around and confines the elastomer mass. The assembly is then encapsulated in an insulative resin material.

This invention relates to semiconductor rectifier assemblies, and more particularly to improved hermetically sealed enclosures for semiconductor rectifier assemblies.

Semiconductor rectifiers are adversely affected by moisture, dust, acids, corrosive ambients and the like. It is, therefore, standard practice to case semiconductor devices in hermetically sealed enclosures. It is known to provide a mound of elastomer insulating material around the semiconductor element and its junction to provide flexibility in this section of the diode assembly and to seal it by an epoxy resin seal to prevent any water from entering the diode, for example, as shown in United States patent specification No. 2,906,932. In such a case like this, the semiconductor element is usually enclosed in a housing of suitable metal. In this conventional means for hermetical seal, however, due to the difference between expansion coefficients of the housing and the epoxy resin seal, in addition to the fact that the epoxy resin exhibits a tendency to age shrinkage, a clearance is produced between them and moisture enters into the device through this clearance to adversely affect the semiconductor element. The larger the size of the assembly is, the greater the clearance may be produced. For this reason, it has been impossible hithertofore to hermetically seal through the utilization of epoxy resin seal semiconductor rectifier assemblies of relatively large sizes with good durability.

The primary object of the invention is to provide improved hermetically sealed enclosures for semiconductor rectifier assemblies in which the above disadvantages can be avoided.

Another object of the invention is to provide improved means for hermetically sealing semiconductor rectifier assemblies with good durability in case of a large size as well as in case of a small size.

A further object of the invention is to provide means for hermetically sealing the semiconductor rectifier assemblies which is economical to fabricate and simple in construction.

Figure 1:
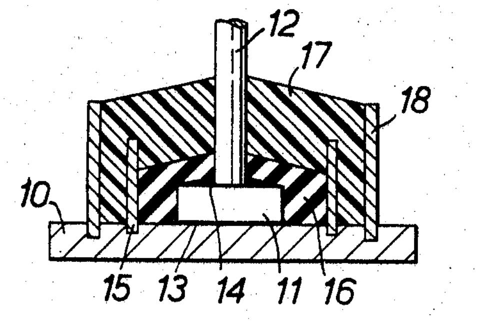

These and other attendant advantages of the invention will be appreciated with reference to the following detailed description in conjunction with the drawings in which:

FIG. 1 is a sectional view of a semiconductor rectifier assembly showing a typical embodiment of the invention; and FIGS. 2 to 6 are similar views to FIG. 1, illustrating some modified embodiments of the invention.

Referring now to the drawings, particularly FIG. 1, the enclosure of the semiconductor device is fabricated by preparing a conductive base plate 10 with two opposite major faces. The exact dimensions of the base plate 10 are not critical. The base plate 10 is preferably formed of a material having a good electrical conductivity as well as a good thermal conductivity, such as copper, so that the heat generated in the semiconductor rectifier assembly during operation may be effectively dissipated through the base plate 10 to the atmosphere. It should, however, be noted that it may be made of any other conductive material. By way of example the base plate 10 may be a square plate of 2 cm. x 4 cm. and 4 mm. thick.

A semiconductor element 11 is bonded by any convenient means, such as soldering, to one major face of the base plate 10 at its central position. The semiconductor element 11 is preferably a silicon crystal with a single PN junction having a specific resistance within the range from 150 to 300 ohm-cm. The exact size and shape of the semiconductor element 11 are not critical. Suitably the semiconductor element 11 is shaped in the form of a wafer and has a diameter of about 8 mm. and a thickness of 0.2 mm. A vertically extending lead 12 is attached to the top face of the semiconductor element 11 by any means well known to the art, such as soldering. The lead 12 may comprise a bundle of filament wires as usual, but preferably it is a copper rod plated with nickel and has a diameter of about 6 mm. The numerals 13 and 14 indicate the soldering layers at the opposite end faces of the semiconductor element 11 for bonding thereto the base plate 10 and the lead 12, respectively. One of the desirable soldering waxes may comprise an eutectic mixture of 40% of lead and 60% of tin which is used at 250° C.

The semiconductor element 11 and its ohmic contacts to the base plate 10 and the lead 12 are surrounded in a spaced relationship by an encircling member 15 which is shaped in a cylindrical form and sealed to one major face of the base plate 10 to form a cup therewith. The encircling member 15 may be made of any metallic material, but it is preferably formed of brass. The sealing engagement of the encircling member 15 with the base plate 10 may be carried out by soldering. The exact dimensions of the encircling member 15 are not critical. For the semiconductor element 11 having such dimensions as mentioned before, it has an external diameter of 12 mm. and a height of 9 mm. from the face of the base plate 10 and is 0.6 mm. thick.

A mound of elastomer material 16 is provided around the semiconductor element 11 and its ohmic contacts within the encircling member 15 to provide flexibility in this section of the rectifier assembly. The elastomer mound 16 is made of insulating thermoresistive, water-resistive and elastic material such as silicon rubber. The exterior contour of the elastomer mound 16 is defined by the encircling member 15. The height of the elastomer mound 16 is lower than the height of the encircling member 1.

In order to completely prevent any water from entering the device, the semiconductor device is then sealed by a suitable sealing material 17 which covers entirely over the encircling member 15 and the elastomer mound 16. The exterior contour of the sealing material 17 is defined by another encircling member 18 which is formed in a cylindrical shape larger in diameter and higher than the member 15 and arranged in coaxial arrangement with and in a spaced relationship from the member 15 so as to surround it. The outer encircling member 18 may be made of the same material as the inner encircling member 15 and is sealed to the top face of the base plate 10 in a similar manner to that of the inner encircling member 15. The dimensions of the outer encircling member 18 are not critical. For the inner encircling member 15 having such dimensions as mentioned before, it has an exterior diameter of 16 mm. with 0.7 mm. in thickness and a height of 12 mm. from the top face of the base plate 10.

Preferably, the sealing material 17 is an epoxy resin, for example, Araldite (a trade name for a resin of this type provided by the Ciba Company of New York, N.Y.), which can be cast at 120° C. and cured at 150° C. In order to reduce the expansion coefficient of the resin, it is desirable to add to the epoxy resin a suitable filler such as powdered silica or quartz. A preferable composition for the cast sealing material 17 is as follows:

| | Parts in weight |
|---|---|
| Araldite F (Ciba Company) | 10.0 |
| Hardener 972 (Ciba Company) | 2.7 |
| Powdered silica | 20.0 |

The semiconductor rectifier as illustrated in the above has the following electrical characteristics:

| | | |
|---|---|---|
| Maximum inverse voltage | volts | 100–1000 |
| Forward voltage drop | do | 0.90 |
| Saturation reverse current | ma | 1 or lower |

The hermetical sealing with a sealing resin potted within the encircling member 18 is advantageous in comparison with the utilization of a glass seal because the sealing operation can be carried out economically and without any technical skill.

The most important feature of the invention is to provide the inner encircling member 15 in conjunction with the elastomer mound 16 and the sealing resin 17. It will be appreciated that in order to obtain a perfect hermetical sealing, the inner encircling member 15 must be incorporated at its bottom end in a sealing engagement to the base member 10 and the inner encircling member 15 and the elastomer mound 16 placed therein must be entirely covered by the sealing resin 17. If the above described semiconductor rectifier assembly were not provided with any inner encircling member, the element 11 would be attached by moisture entering along clearances which might be produced between the epoxy resin 17 and the outer encircling member 18 and between the epoxy resin 17 and the top face of the base plate 10 due to the age shrinkage of the epoxy resin 17 and/or the difference between expansion coefficients of the epoxy resin 17 and outer encircling member 18. The heat expansion coefficient of the epoxy resin is about $$50\text{—}60\times10^{-6}/^\circ\text{ C.}$$

while that of copper is only $16.5\times10^{-5}/^\circ$ C. According to the invention, however, any moisture, dust and the like are completely prevented at the position of the inner encircling member 15 from entering the device. In addition, age shrinkage of the epoxy resin affects not adversely but conveniently the semiconductor rectifier assembly because the shrinkage force will press the inner encircling member 15 in the inward direction so as to increase sealing effect for the device. According to the invention, therefore, a complete hermetical seal can be expected in case of a large size as well as in case of a relatively small size.

We have carried out two seal tests with respect to the semiconductor rectifier assembly herein described. One is the so-called "spot check" which utilizes colored liquid having high impregnation ability and can detect colored liquid leakage corresponding to gas leakage of $10^{-7}$ atm. cc./sec. The other is the helium detector test, well known in the art of mass spectroscopes, in which helium gas leakage can be detected in the order of $10^{-10}$ atm. cc./sec. These two seal tests were applied to the semiconductor rectifier assembly after it has ben subjected to a heat cycle test at 0° C. and 150° C. alternately applied each for five minutes. The test results show that the hermetical seal (liquid-or-air-tightness) was perfectly maintained as original. Another heat cycle test was also applied to the semiconductor rectifier assembly with the heat cycle of 30,000 times of 30° C. and 150° C. each for five minutes and with 35 ampere D.C. in the forward direction. No appreciable change was found in the rectifying properties as well as in the seal tests. The semiconductor rectifier assembly was subjected to a heat soaking test at 150° C. for 4,000 hours. No appreciable change was found in the maximum inverse voltage although the reverse current was changed within the range of ±0.1 ma. To the contrary, in case of conventional assemblies with no inner encircling member, it was found that it was destroyed by the heat soaking at 150° C. for 500–1000 hours.

FIGS. 2 to 6 illustrate some other embodiments of the invention in which certain modifications are applied. The same reference numerals as those in FIG. 1 indicate the corresponding members throughout FIGS. 2 to 6.

Figure 2:
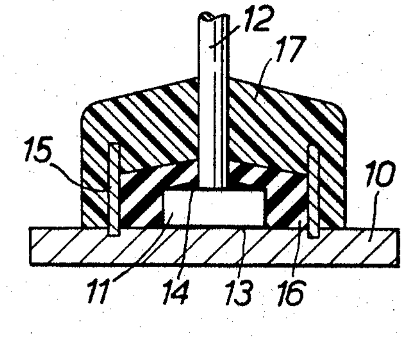

The embodiment illustrated in FIG. 2 dispenses with the outer encircling member 17 for defining the exterior boundary of the epoxy resin 17 because once the epoxy resin has been hardened, a support for the epoxy resin layer 17 is not necessarily required.

Figure 3:
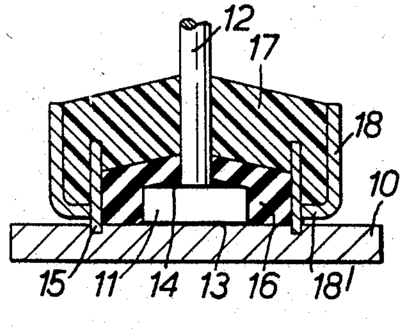

In another embodiment illustrated in FIG. 3, the outer encircling member 18 is incorporated at its bottom 18' to the lower end portion of the inner encircling member 15.

Figure 4:
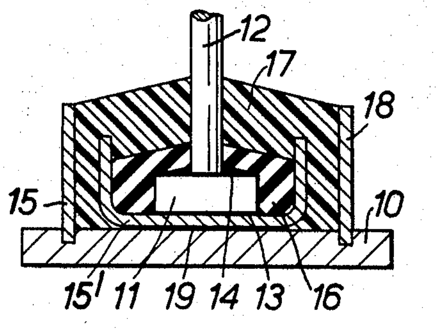

FIG. 4 illustrates a further embodiment in which the inner encircling member 15 is shaped in the form of a complete cup with a bottom 15'. The semiconductor element 11 is bonded on the interior surface of the bottom 15' by soldering 13 and the exterior surface of the bottom 15 is bonded to the top surface of the base plate 10 by soldering 19.

Figure 5:
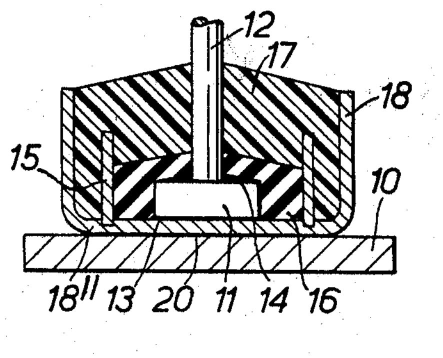

A still further embodiment is illustrated in FIG. 5, in while the outer encircling member 18 is shaped in the form of a complete cup with a bottom 18''. The semiconductor element 11 and the inner encircling member 15 are soldered on the interior surface of the bottom 18'' and the exterior surface of the bottom 18'' is bonded to the top surface of the base plate 10 by soldering 20.

Figure 6:
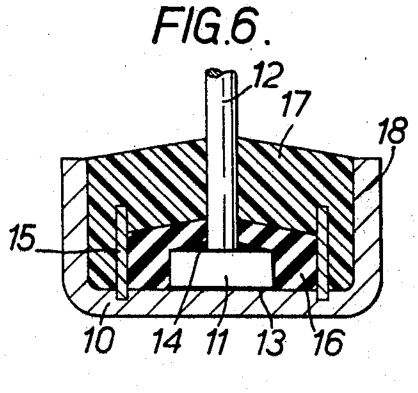

In the other embodiment illustrated in FIG. 6, the outer encircling member 18 is formed as an extension of the base plate 10 at its periphery.

Similar test results to these with respect to the embodiment illustrated in FIG. 1 have been obtained with respect to each of embodiments illustrated in FIGS. 2 to 6, respectively.

What is claimed is:

1. A semiconductor rectifier assembly, comprising an ohmic contact conductive base member, a semiconductor rectifier element bonded to said base member, an ohmic contact lead attached to the opposite side of said rectifier element, and encircling member surrounding said rectifier element in a spaced relationship therefrom, said encircling member being formed of metal and incorporated in a sealing engagement to said base member, a mound of elastomer insulating material enclosing said rectifier element and its ohmic contacts within said encircling member, and a sealing resin layer concealing said encircling member with said mound of elastomer insulating material.

2. A semiconductor rectifier assembly, comprising an ohmic contact conductive base member, a semiconductor rectifier element bonded to said base member, an ohmic contact lead attached to the opposite side of said rectifier element, an inner encircling member surrounding said rectifier element in a spaced relationship therefrom, said inner encircling member being formed of metal and incorporated in a sealing engagement to said base member, a mound of elastomer insulating material enclosing said rectifier element and its ohmic contacts within said inner encircling member, an outer encircling member surrounding said inner encircling member in a spaced relationship therefrom, said outer encircling member being arranged in a coaxial alignment with said inner encircling member and incorporated to said base member, and a sealing resin material potted within said outer encircling member so as to entirely enclose said inner encircling member with said mound of elastomer insulating material.

3. A semiconductor rectifier assembly as defined in claim 2, in which each of said encircling members is soldered to said conductive base member.

4. A semiconductor rectifier assembly as defined in claim 2, in which the outer encircling member is taller than the inner encircling member.

5. A semiconductor rectifier assembly, comprising an ohmic contact conductive base member, a semiconductor rectifier element bonded to said base member, an ohmic contact lead attached to the opposite side of said rectifier element, an inner encircling member surrounding said rectifier element in a spaced relationship therefrom, said inner encircling member being incorporated in a sealing engagement to said base member, a mound of elastomer insulating material enclosing said rectifier element and its ohmic contacts within said inner encircling member, an outer encircling member surrounding said inner encircling member in a spaced relationship therefrom, said outer encircling member being arranged in a coaxial alignment with said inner encircling member and incorporated to said inner encircling member, and a sealing resin material potted within said outer encircling member so as to entirely enclose said inner encircling member with said mound of elastomer insulating material.

6. A semiconductor rectifier assembly, comprising an ohmic contact conductive base member, an inner encircling member in the form of a cup, said inner encircling member being formed of metal and bonded to said conductive base member, a semiconductor rectifier element bonded at the interior surface of the bottom of said inner encircling member, an ohmic contact lead attached to the opposite side of said rectifier element, a mound of elastomer insulating material enclosing said rectifier element and its ohmic contacts within said inner encircling member, an outer encircling member surrounding said inner encircling member in a spaced relationship therefrom, said outer encircling member being arranged in a coaxial alignment with said inner encircling member and incorporated to said base member, and a sealing resin material potted within said outer encircling member so as to entirely enclose said inner encircling member with said mound of elastomer insulating material.

7. A semiconductor rectifier assembly, comprising an ohmic contact conductive base member, an outer encircling member in the form of a cup, said outer encircling member bonded to said conductive base member, a semiconductor rectifier element bonded at the interior surface of the bottom of said outer encircling member, an ohmic contact lead attached to the opposite side of said rectifier element, an inner encircling member surrounding said rectifier element, said inner encircling member being formed of metal and incorporated in a sealing engagement to said outer encircling member at the interior surface of the bottom of said outer encircling member, a mound of elastomer insulating material enclosing said rectifier element and its ohmic contacts within said inner encircling member, and a sealing resin material potted within said outer encircling member so as to entirely enclose said inner encircling member with said mound of elastomer insulating material.

8. A semiconductor rectifier assembly as defined in claim 2, in which said base member and said outer encircling member are incorporated in one body to form a cup-shaped housing.

References Cited

UNITED STATES PATENTS

| | | | |
|---|---|---|---|
| 2,829,320 | 4/1958 | Dimond | 317—234 |
| 2,906,931 | 9/1959 | Armstrong | 317—235 |
| 2,906,932 | 9/1959 | Fedotowsky et al. | 317—240 |
| 2,946,935 | 7/1960 | Finn | 317—234 |
| 3,212,160 | 10/1965 | Dale et al. | 317—234 X |
| 3,223,903 | 12/1965 | Solomon | 317—235 |

JAMES D. KALLAM, *Primary Examiner.*

U.S. Cl. X.R.

264—272; 317—242